(12) United States Patent
Batish

(10) Patent No.: US 7,179,688 B2
(45) Date of Patent: Feb. 20, 2007

(54) METHOD FOR REDUCING OR ELIMINATING SEMICONDUCTOR DEVICE WIRE SWEEP IN A MULTI-TIER BONDING DEVICE AND A DEVICE PRODUCED BY THE METHOD

(75) Inventor: Rakesh Batish, Royersford, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 59 days.

(21) Appl. No.: 11/004,750

(22) Filed: Dec. 3, 2004

(65) Prior Publication Data

US 2005/0121798 A1  Jun. 9, 2005

Related U.S. Application Data

(63) Continuation-in-part of application No. 10/686,892, filed on Oct. 16, 2003, now Pat. No. 6,847,122, and a continuation-in-part of application No. 10/686,974, filed on Oct. 16, 2003, now Pat. No. 6,955,949.

(60) Provisional application No. 60/587,678, filed on Jul. 14, 2004.

(51) Int. Cl.
H01L 21/48 (2006.01)
(52) U.S. Cl. .............................. 438/127; 257/E21.502
(58) Field of Classification Search ................ 438/106, 438/107, 110, 111, 112, 121, 123, 124, 127
See application file for complete search history.

(56) References Cited

U.S. PATENT DOCUMENTS

| | | | |
|---|---|---|---|
| 4,523,371 A | 6/1985 | Wakashima | |
| 4,788,583 A | 11/1988 | Kawahara et al. | |
| 4,974,057 A | 11/1990 | Tazima | |
| 5,097,317 A | 3/1992 | Fujimoto et al. | |
| 5,206,794 A | 4/1993 | Long | |
| 5,310,702 A | 5/1994 | Yoshida et al. | |
| 5,331,205 A | 7/1994 | Primeaux | |
| 5,434,105 A | 7/1995 | Liou | |
| 5,656,830 A | 8/1997 | Zechman | |
| 5,736,792 A | 4/1998 | Orcutt | |
| 5,818,105 A | 10/1998 | Kouda | |
| 5,824,568 A | 10/1998 | Zechman | |
| 5,863,810 A * | 1/1999 | Kaldenberg | 438/27 |
| 6,177,726 B1 | 1/2001 | Manteghi | |
| 6,184,587 B1 | 2/2001 | Khandros et al. | |
| 6,215,182 B1 | 4/2001 | Ozawa et al. | |
| 6,297,078 B1 | 10/2001 | Barrow | |
| 6,340,846 B1 | 1/2002 | LoBianco et al. | |
| 6,344,401 B1 | 2/2002 | Lam | |

(Continued)

FOREIGN PATENT DOCUMENTS

EP 0601323 A 6/1994

(Continued)

Primary Examiner—Scott B. Geyer
(74) Attorney, Agent, or Firm—Christopher M. Spletzer, Sr.

(57) ABSTRACT

A method of packaging a multi-tier wire bonded semiconductor device is provided. The method includes applying an insulative material across only a portion of at least two of a plurality of conductors per layer providing interconnection between elements in the multi-tier wire bonded semiconductor device. The method also includes encapsulating the conductors and elements, thereby packaging the semiconductor device.

28 Claims, 13 Drawing Sheets

U.S. PATENT DOCUMENTS

| | | |
|---|---|---|
| 6,368,899 B1 | 4/2002 | Featherby et al. |
| 6,395,807 B1 | 5/2002 | Kinose et al. |
| 6,429,044 B1 * | 8/2002 | Tuttle .................. 438/106 |
| 2003/0027918 A1 | 2/2003 | Tsutsumi et al. |
| 2003/0090001 A1 | 5/2003 | Beatson et al. |

FOREIGN PATENT DOCUMENTS

| | | |
|---|---|---|
| GB | 2279944 A | 1/1995 |
| JP | 03229433 A | 10/1991 |
| JP | 04158557 A | 6/1992 |
| JP | 09129663 A | 5/1997 |
| JP | 11087424 A | 3/1999 |
| JP | 2001068802 A | 3/2001 |
| JP | 2002368029 A | 12/2002 |

\* cited by examiner

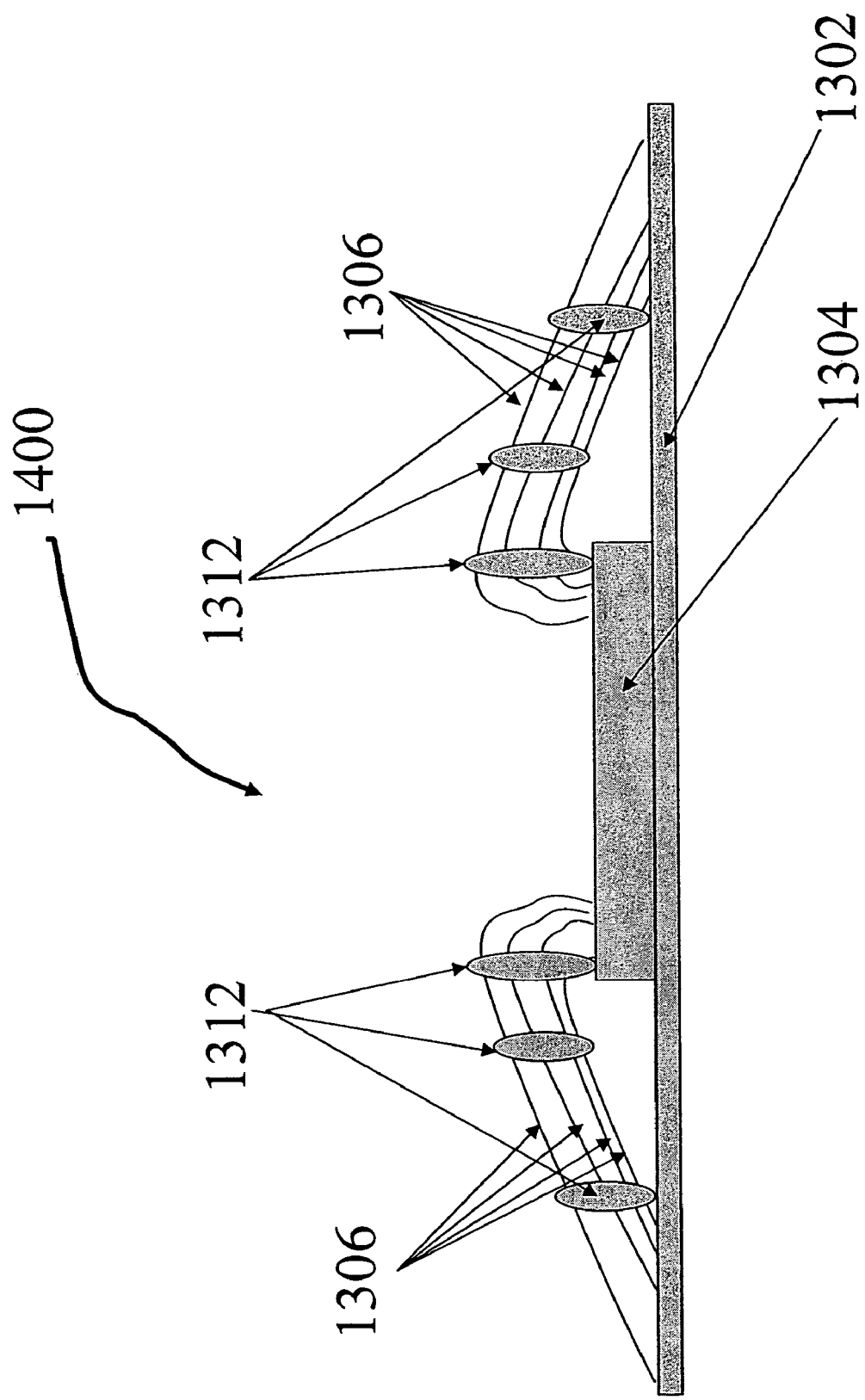

METHOD FOR REDUCING OR ELIMINATING SEMICONDUCTOR DEVICE WIRE SWEEP IN A MULTI-TIER BONDING DEVICE AND A DEVICE PRODUCED BY THE METHOD

CROSS REFERENCE TO RELATED APPLICATION

This application is a continuation-in-part of U.S. patent application Ser. No. 10/686,892, filed on Oct. 16, 2003 now U.S. Pat. No. 6,847,122, and a continuation-in-part of U.S. patent application Ser. No. 10/686,974, filed on Oct. 16, 2003, now U.S. Pat. No. 6,955,949, and also claims the benefit of priority to U.S. Provisional Patent Application No. 60/587,678, filed on Jul. 14, 2004, the contents of which are incorporated in this application by reference.

FIELD OF THE INVENTION

This invention relates to packaging semiconductor devices, and more particularly to a method of reducing or eliminating wire sweep and sway in packaged semiconductor devices.

BACKGROUND OF THE INVENTION

In the fabrication of semiconductor devices, conductors (e.g., bonding wires) are often utilized to provide interconnection between elements of the semiconductor device. For example, FIG. 1 illustrates a portion of conventional semiconductor device 100. Semiconductor device 100 includes leadframe 102 and leadframe contact(s) 102a. Semiconductor element (e.g., die) 104 is mounted on leadframe 102. Bonding wire 106 provides interconnection between semiconductor element 104 and leadframe contact 102a. Overmold 108 (i.e., a mold compound) is provided over bonding wire 106, semiconductor element 104, and leadframe contact 102a. In the configuration illustrated in FIG. 1, a number of bonding wires 106 may be included in semiconductor device 100 to provide interconnection between various connection points on semiconductor element 104 and corresponding leadframe contacts 102a.

During the process of fabricating semiconductor device 100, short circuits between adjacent bonding wires 106, or open circuits in connection with one or more bonding wires 106 may occur. For example, during fabrication, movement (e.g., sway, sweep, etc.) of bonding wires 106 may result in a short circuit between adjacent bonding wires 106. Further, such movement of bonding wires may cause one or more bonding wires 106 to break, thus, causing an open circuit.

FIG. 2 illustrates a conventional semiconductor device 200 including an encapsulant 210 over bonding wire 106. Encapsulant 210 also covers the connection points between bonding wire 106 and each of semiconductor element 104 and leadframe contact 102a. In other respects, the elements illustrated in FIG. 2 are very similar to those illustrated and described above with respect to FIG. 1.

FIG. 3 is a perspective view of a conventional semiconductor device 100, similar to the device illustrated in FIG. 1. Semiconductor element 104 is illustrated mounted on leadframe 102. A plurality of bonding wires 106 provide interconnection between semiconductor element 104 and corresponding leadframe contacts 102a. Overmold 108 (partially cut away in FIG. 3) is provided over semiconductor element 104 and bonding wires 106.

FIG. 4 is a cut away side view of a conventional semiconductor device 400. As in FIGS. 1–3, semiconductor element 104 is mounted on leadframe 102, and bonding wires 106 provide interconnection between semiconductor element 104 and leadframe contacts 102a. Encapsulant 410 is provided over semiconductor element 104, and bonding wires 106. Overmold 108 is provided above and below semiconductor element 104 in the illustration of FIG. 4.

Various problems have been found in the conventional semiconductor device configurations illustrated in FIGS. 1–4. As provided above, during fabrication and movement of the semiconductor devices, bonding wires 106 may be become loose (i.e., open circuit) at one of the connection points (i.e., at semiconductor element 104 or leadframe contact 102a). Further, adjacent bonding wires 106 may move (e.g., sway) towards each other, thereby creating short circuits in the semiconductor device. These issues are particularly problematic in view of the desire to decrease the size of semiconductor devices (and the corresponding desire to increase conductor density in semiconductor devices). These fabrication shortcomings result in defective components within semiconductor lots, resulting in higher manufacturing costs and poor reliability. As such, it would be desirable to provide improved methods of fabricating semiconductor devices.

SUMMARY OF THE INVENTION

To overcome the deficiencies of the prior art, in an exemplary embodiment of the present invention, a method of packaging a multi-tier wire bonded semiconductor device is provided. The method includes applying an insulative material across only a portion of at least two of a plurality of conductors per layer providing interconnection between elements in the multi-tier wire bonded semiconductor device.

According to another aspect of the present invention, an encapsulant is applied to the conductors and elements, thereby packaging the semiconductor device.

According to yet another aspect of the present invention, the insulative compound comprises spherical silica particles to maintain a predetermined separation between adjacent ones of the plural conductors.

According to still another aspect of the present invention, the insulative compound is applied in a substantially circumferential manner about the at least one the semiconductor element.

According to a further aspect of the present invention, the insulative compound is applied in at least two geometric shape structures, each of the geometric shape structures substantially surrounding the at least one the semiconductor element in a circumferential manner.

According to still a further aspect of the present invention, the insulative material is applied in at least two distinct structures around a peripheral portion of the at least one the semiconductor element, the two structures not being in contact with one another.

According to yet a further aspect of the present invention, a semiconductor device comprises a plurality of semiconductor elements; a plurality of conductors arranged in a multiple tier configuration providing interconnection between the plurality of semiconductor elements; and an insulative material applied across only a portion of at least two of the plurality of conductors in at least two tiers of the multiple tiers.

These and other aspects will become apparent from the detailed description provided below.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIG. 14A is a cut away side view of an interconnection between semiconductor elements in a multi-tier wire bonded semiconductor device in accordance with another exemplary embodiment of the present invention.

DETAILED DESCRIPTION OF THE INVENTION

Figure 1:
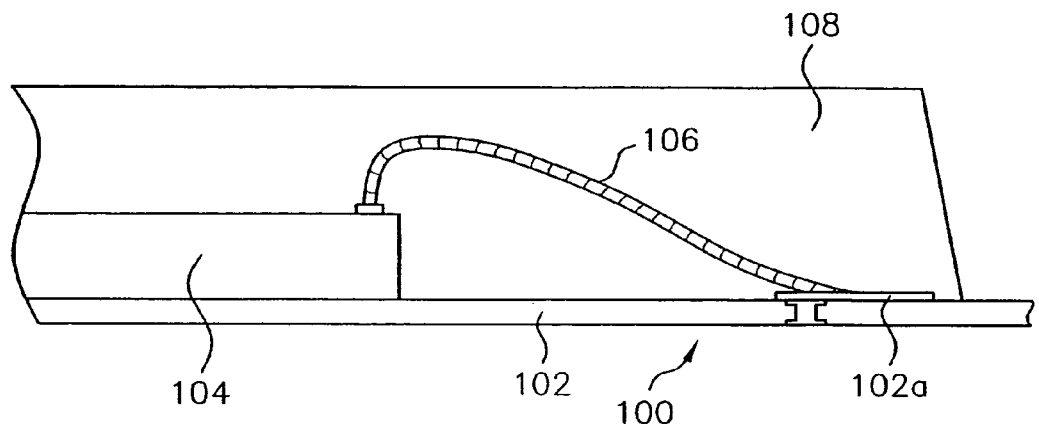
FIG. 1 is a cut away side view of an interconnection between semiconductor elements in a prior art semiconductor device.
Figure 2:
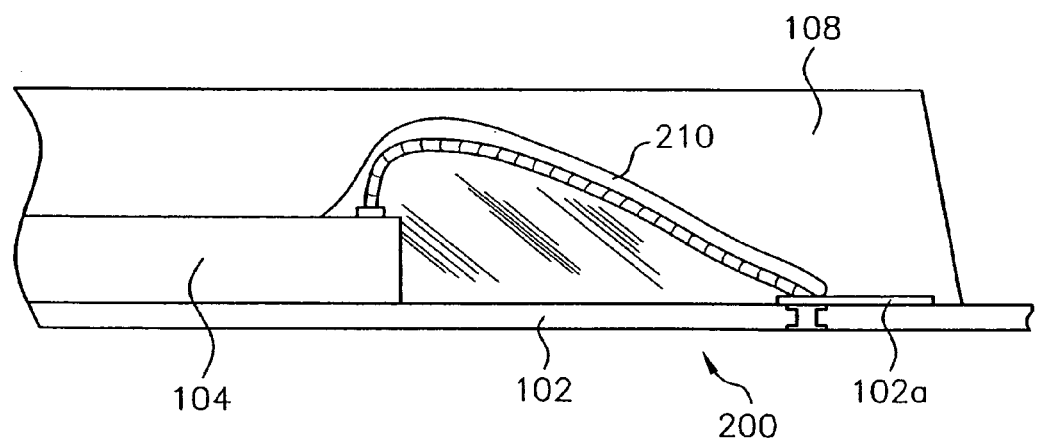
FIG. 2 is a cut away side view of an encapsulated interconnection between semiconductor elements in a prior art semiconductor device.
Figure 3:
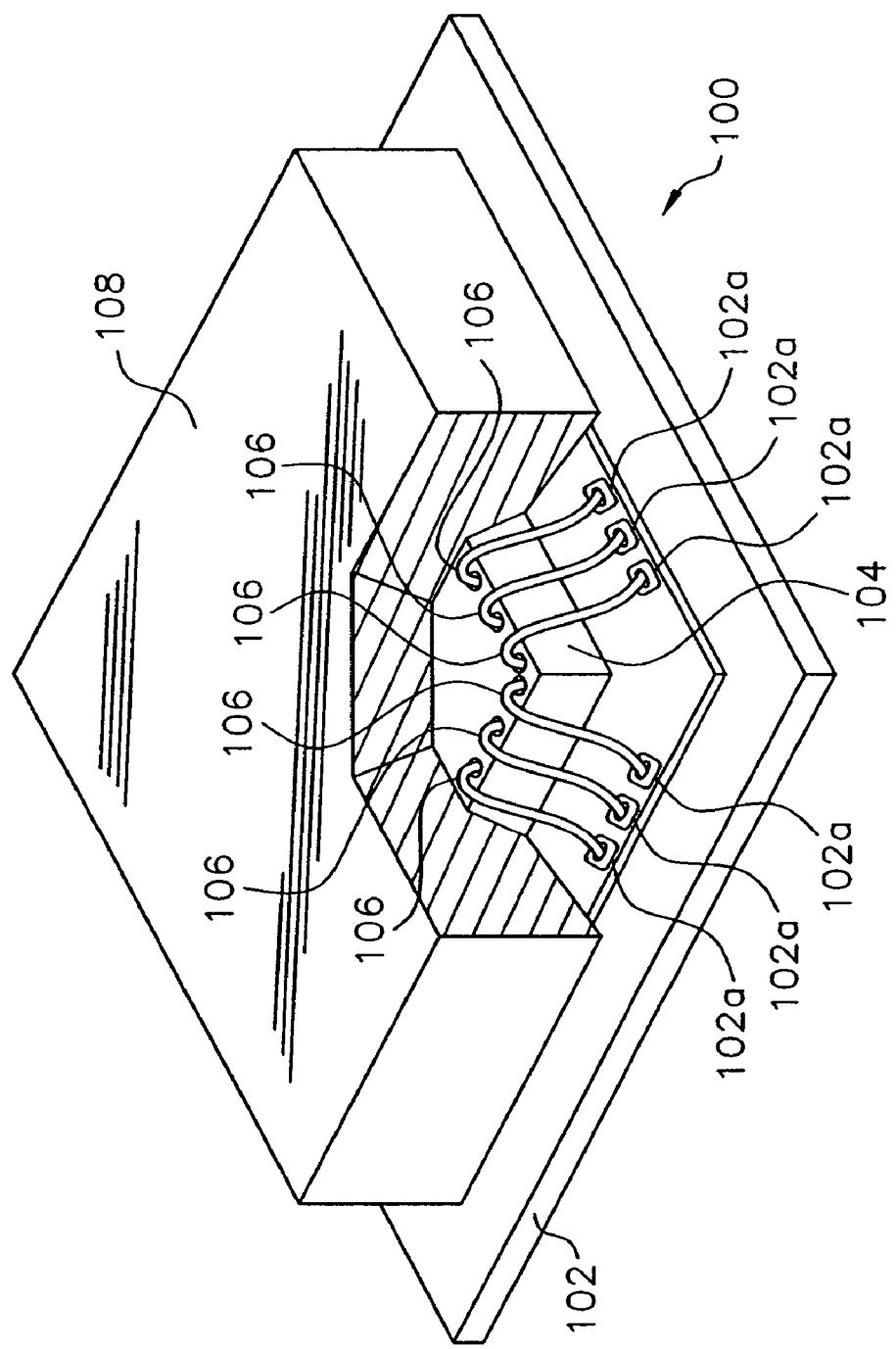
FIG. 3 is a perspective view of a plurality of interconnections between semiconductor elements in a prior art semiconductor device.
Figure 4:
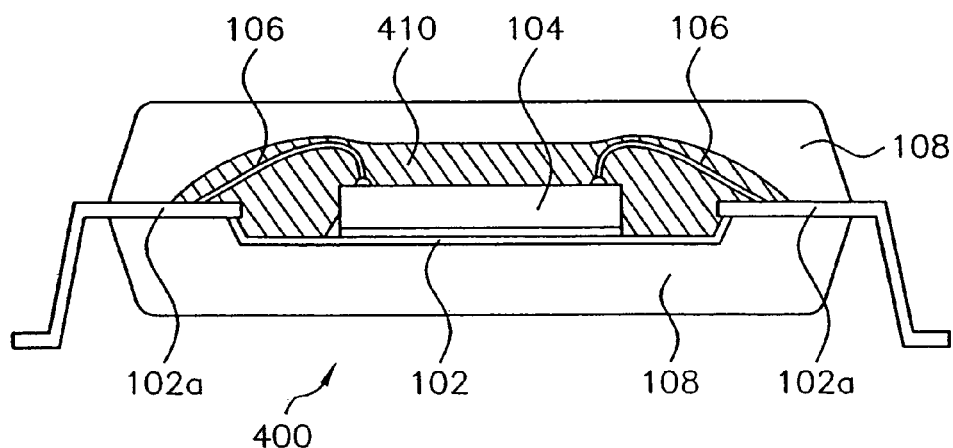
FIG. 4 is a cut away side view of an encapsulated interconnection between semiconductor elements in a prior art semiconductor device.

Preferred features of selected embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

As used herein, the term semiconductor device relates to a broad category of devices including packaged semiconductor devices such as integrated circuits, memory devices, DSPs (i.e., digital signal processors), QFP (i.e., quad-flat package), PBGA (i.e., plastic ball grid array), BOC (board on chip), COB (i.e., chip on board), CABGA (chip array ball grid array), and discrete devices (i.e., non-packaged devices, may be more than one device on one board). Further, the term semiconductor element refers to any portion of a semiconductor device, including substrates, dies, chips, leadframes, leadframe contacts, etc.

Generally speaking, the present invention relates to placing a insulative material (e.g., in the form of a polymer bead, strip, or preformed shape) across bonding conductors (i.e., bonding wires) that provide interconnection between various semiconductor elements in a semiconductor device.

The insulative material (e.g., a polymer bridge) creates a lattice (i.e., a lattice bridge) or structure which will provide additional stability to the conductors such that the conductors are separated (i.e., not short-circuited) during further processing (e.g., during transfer molding). Further, if the insulative material is applied as at least partially fluid, it may distribute, through fluid forces, throughout the interconnected conductor network during molding of the semiconductor device. This separation and force transfer reduces wire sweep and sway, and reduces or eliminates short circuiting resulting from an overmolding process.

After application of the insulative material (e.g., a polymer material such as an epoxy resin), the resin is cured using at least one of heat or ultraviolet energy. An overmold may then be applied to provide a packaged semiconductor device without the wires moving or "sweeping" toward one another.

According to certain embodiments of the present invention, the methods and devices disclosed herein are particularly suited to the assembly of bonding wired semiconductor devices fabricated by contract and integrated device manufacturers. Certain embodiments of the present invention are particularly useful in relation to semiconductor devices having long conductors/bonding wires, or having complex bonding wired geometries (e.g., QFPs, stacked die devices, and BGAs).

In contrast to prior art fabrication methods, various embodiments of the present invention utilize very little insulative material (e.g., a polymer material) in ring, rectangular, and/or any suitable configurations around or about a semiconductor element included in the semiconductor device.

As will be explained herein, certain embodiments of the present invention provide additional advantages over prior art fabrication techniques, including: additional flexibility in the fabrication process, minimization of expensive polymer used for stabilizing the conductors, and universal semiconductor device application. Exemplary embodiments of the present invention reduce sweep on complex semiconductor device types (e.g., stacked die devices), and allow for extended conductor lengths in, for example, QFPs and BGAs.

Figure 5:
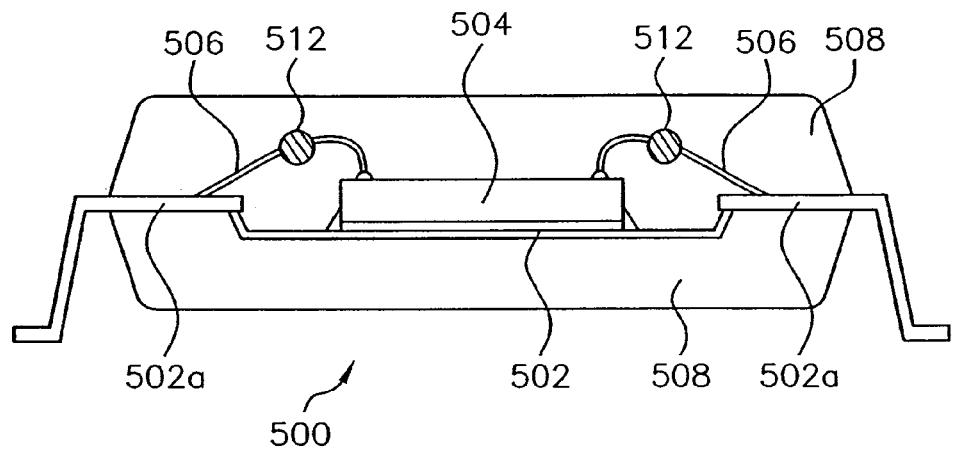
FIG. 5 is a cut away side view of an interconnection between semiconductor elements in a semiconductor device in accordance with an exemplary embodiment of the present invention.

FIG. 5 illustrates a cut away side view of semiconductor device 500 in accordance with an exemplary embodiment of the present invention. Semiconductor device 500 includes semiconductor element 504 (e.g., a die) mounted on leadframe 502. For example, semiconductor element 504 may be mounted to leadframe 502 using an adhesive. Bonding wires 506 provide interconnection between semiconductor element 504 and leadframe contacts 502*a*. Before overmold 508 is applied to the device, insulative material 512 is applied to a portion of bonding wires 506. For example, insulative material 512 may be applied in a rectangular, ring, and/or any suitable shape around or about semiconductor element 504. Further, insulative material 512 may be positioned closer to semiconductor element 504 (as opposed to leadframe contacts 502*a*), because bonding wires 506 have a closer pitch (i.e., are closer to adjacent bonding wires 506) at semiconductor element 504 than at leadframe contacts 502*a*. Alternatively, insulative material 512 may be positioned midway between semiconductor element 504 and leadframe contacts 502*a*. Further still, insulative material 512 may be positioned at any of a number of locations between semiconductor element 504 and leadframe contacts 502*a*, as desired in a given device.

By providing insulative material 512 across bonding wires 506, the position of each of the bonding wires 506 with respect to one another is stabilized. By stabilizing bonding wires 506 with respect to one another using insulative material 512, the risk of short circuiting adjacent bonding wires 506 during application of overmold 508 is substantially reduced if not eliminated. Additionally, by stabilizing the position of bonding wires 506, open circuiting of bonding wires 506 during fabrication may also be substantially reduced.

Insulative material 512 may be, for example, a polymer material such as an epoxy resin. Additionally, insulative material 512 may include insulative particles or beads that distribute between bonding wires 506 during application of insulative material 512 to bonding wires 506. Such insulative beads further stabilize bonding wires 506 with respect to one another. According to an exemplary embodiment of the present invention, the insulative beads distributed in the insulative material have a mean particle size of approximately 4.1 µm, a median particle size of 4.5 µm, and a maximum particle size of 20 µm. These insulative beads may be, for example, spherical silica particles.

Figure 6:
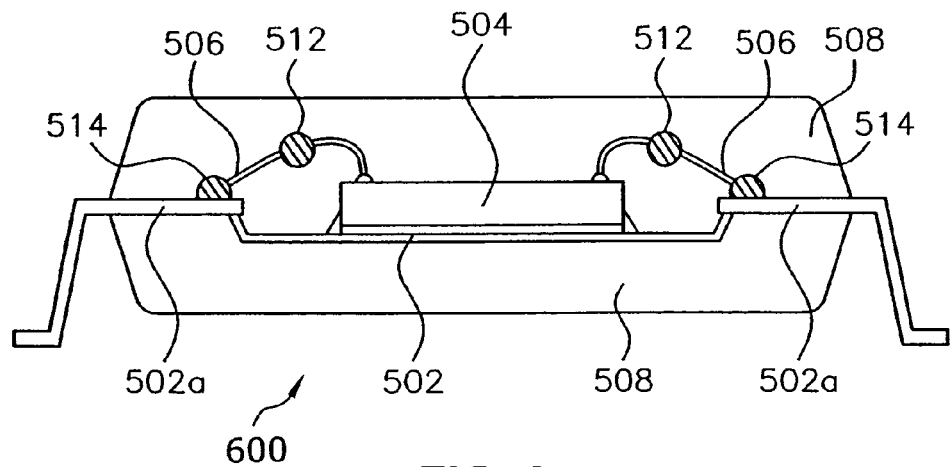
FIG. 6 is a cut away side view of an interconnection between semiconductor elements in a semiconductor device in accordance with another exemplary embodiment of the present invention.

FIG. 6 is a cut away side view of semiconductor device 600, where semiconductor device 600 is similar to the semiconductor device 500 illustrated in FIG. 5. As with the exemplary embodiment of the present invention illustrated in FIG. 5, FIG. 6 illustrates insulative material 512 provided across a portion of bonding wires 506. However, in additional to insulative material 512, FIG. 6 also illustrates insulative material 514 provided across another portion of bonding wires 506. Insulative material 514 may be provided in a similar configuration to insulative material 512 (e.g., in a rectangular, ring, and/or any suitable shape around or about semiconductor element 504). Additionally, insulative material 514 may be a polymer material such as an epoxy resin, and may include insulative beads as described above with respect to FIG. 5.

Figure 7:
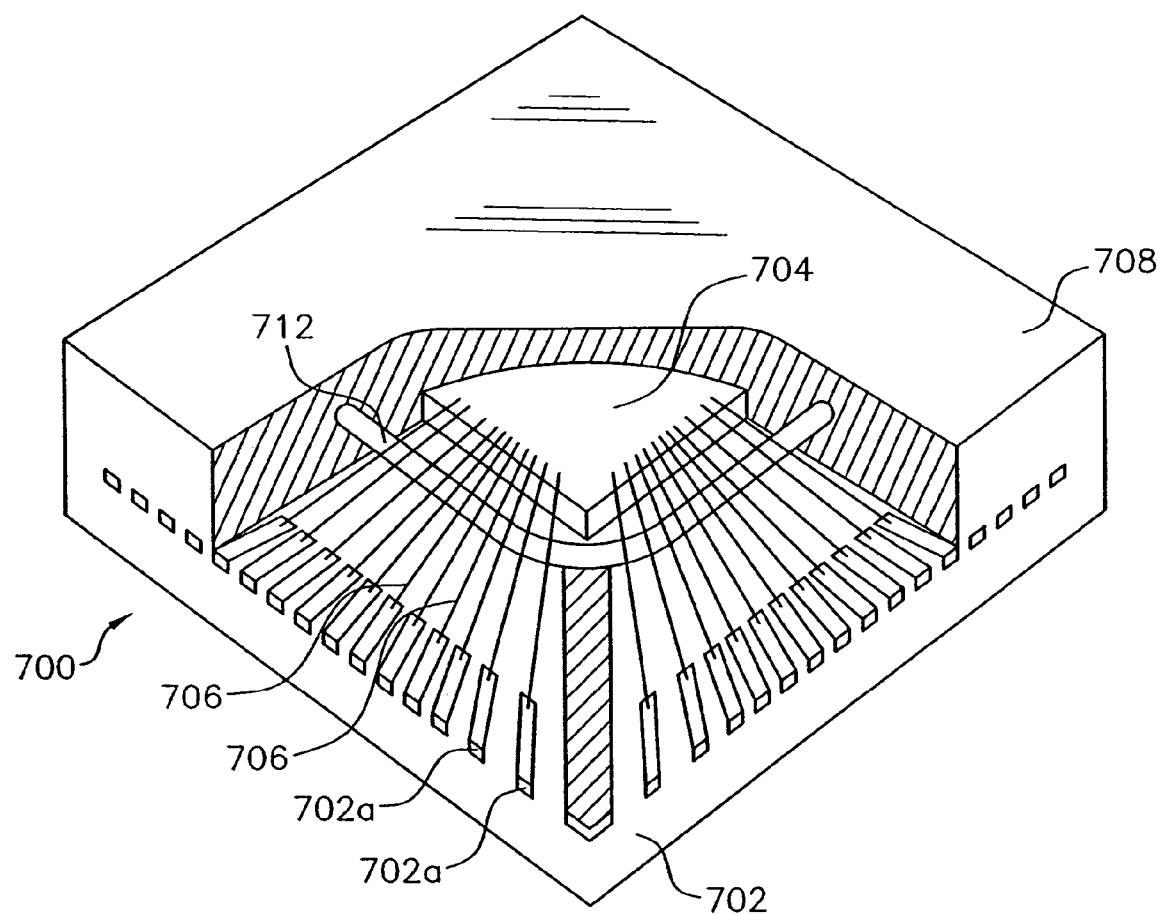
FIG. 7 is a perspective view of an interconnection between semiconductor elements in a semiconductor device in accordance with an exemplary embodiment of the present invention.

FIG. 7 illustrates a semiconductor device 700 including semiconductor element 704 mounted on leadframe 702. Bonding wires 706 provide interconnection between semiconductor element 704 and leadframe contacts 702*a*. Insulative material 712 is provided across a portion of bonding wires 706 to stabilize bonding wires 706 with respect to one another. In the exemplary embodiment of the present invention illustrated in FIG. 7, insulative material 712 is provided in a substantially ring shape (and/or any suitable shape) around or about semiconductor element 704. By providing insulative material 712 across a portion of bonding wires 706, open or short circuiting of bonding wires 706 may be substantially reduced prior to and during application of overmold 708.

Figure 8:
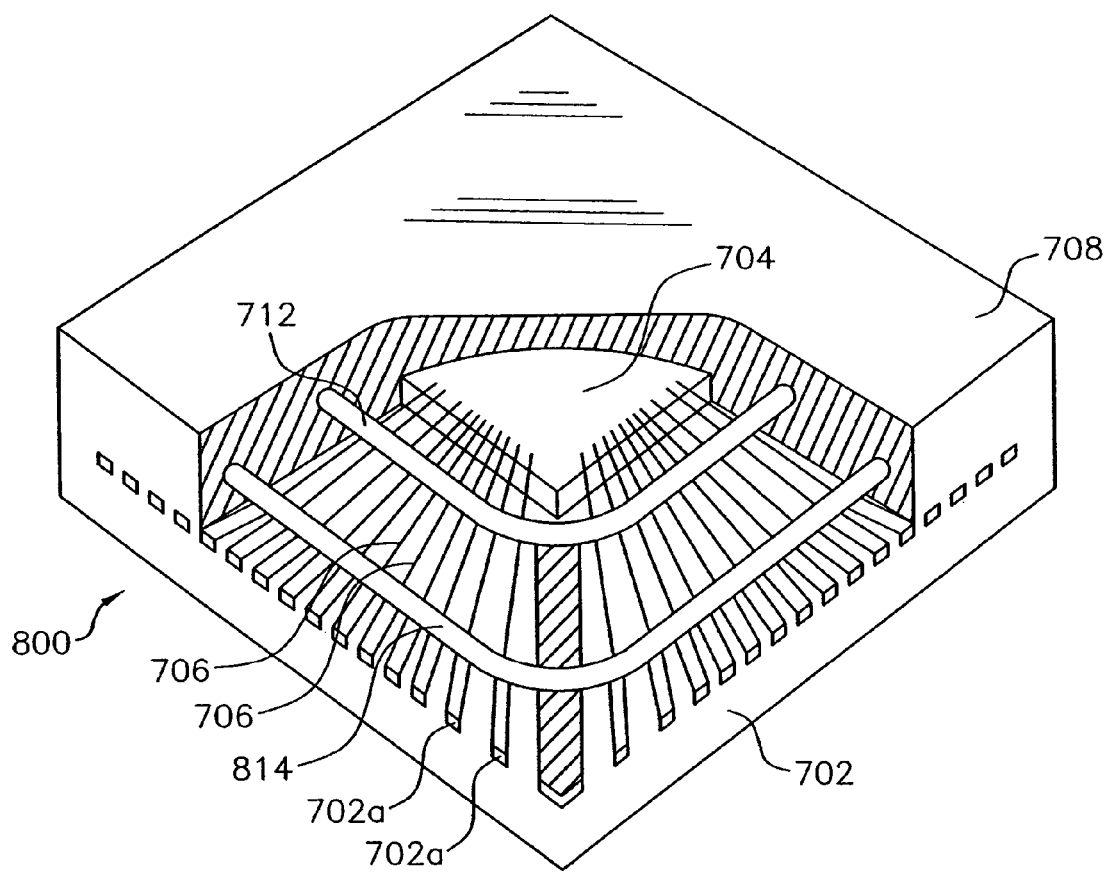
FIG. 8 is a perspective view of an interconnection between semiconductor elements in a semiconductor device in accordance with another exemplary embodiment of the present invention.

FIG. 8 is a perspective view of semiconductor device 800 similar to the device illustrated in FIG. 7. In addition to the ring shaped insulative material 712 provided in FIG. 7, FIG. 8 illustrates insulative material 814 provided across a portion of bonding wires 706. By providing insulative material 814 in addition to insulative material 712, bonding wires 706 are further stabilized with respect to one another.

Although FIG. 7 illustrates semiconductor device 700 including single insulative material ring 712, and FIG. 8 illustrates semiconductor device 800 including insulative material ring 712 and insulative material ring 814, additional rings (or other shaped portions) of an insulative material may be provided. As such, one, two, three, or any of a number of rings/beads of insulative material may be applied to a given semiconductor device, as desired.

Figure 9:
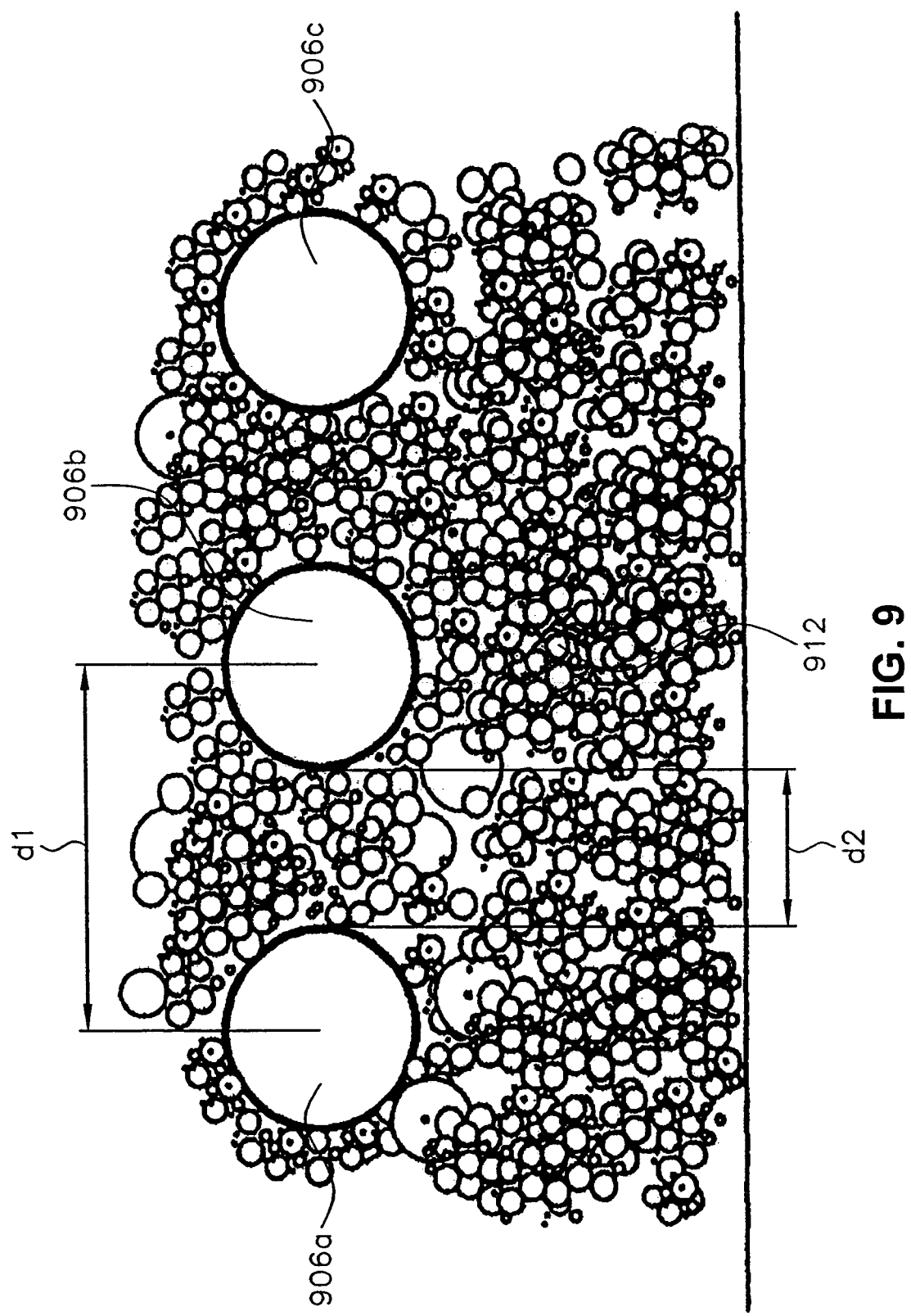
FIG. 9 is a cut away view of conductors separated by an insulative material in accordance with an exemplary embodiment of the present invention.

FIG. 9 is a cut away view of bonding wires 906*a*, 906*b*, and 906*c*. For example, bonding wires 906*a*, 906*b*, and 906*c* provide interconnection between a semiconductor element (not shown in FIG. 9) and leadframe contacts (not shown in FIG. 9) in a semiconductor device. Insulative material 912 is provided across a portion of bonding wires 906*a*, 906*b*, and 906*c*. In the exemplary embodiment of the present invention illustrated in FIG. 9, insulative material 912 includes insulative beads. The insulative beads may be of a variety of different sizes, and because the insulative beads are smaller than the distance between adjacent bonding wires (e.g., between bonding wire 906*a* and 906*b*), the insulative beads disperse into a position between adjacent bonding wires, thereby providing enhanced stability and insulation between adjacent bonding wires.

FIG. 9 illustrates a distance "d1" representing a center-to-center distance (i.e., pitch) between bonding wires 906*a* and 906*b*. Further, FIG. 9 illustrates a distance "d2" representing a spacing between bonding wires 906*a* and 906*b*. According to an exemplary embodiment of the present invention, the insulative material may be applied to ultrafine pitch bonding wired semiconductor devices. For example, distance d1 in such a device may be approximately 35 µm or less, and distance d2 in such a device may be approximately 15 µm or less. By providing insulative material (e.g., with insulative beads dispersed therein) across a portion of the bonding wires, the improved bonding wire stability of the present invention may be applied to ultrafine pitch bonding wired semiconductor devices with small values for distances d1 and d2.

By fabricating semiconductor devices according to the methods described herein, conductor density within a semiconductor device may be increased, desirably resulting in a semiconductor device of decreased size.

An additional benefit of fabricating semiconductor devices according to the present invention is that because of the inclusion of the insulative material across a portion of the bonding wires, the overmold/encapsulation material used to encapsulate the device may be constructed of a less expensive material and process (e.g., mold type encapsulation as opposed to "glob-topping") because the encapsulant does not necessarily need to stabilize the bonding wires.

The beads included in the insulative material utilized according to various exemplary embodiments of the present invention may be any of a number of types of insulative beads. For example, the beads may be constructed of a silica filler. Further, the insulative beads may be of varying types having varying sizes and shapes.

The insulative material of the present invention may include a high viscosity, ultraviolet curable silica. For example, the insulative material may be filled with silica at a weight percentage between 50–85%.

Figure 10:
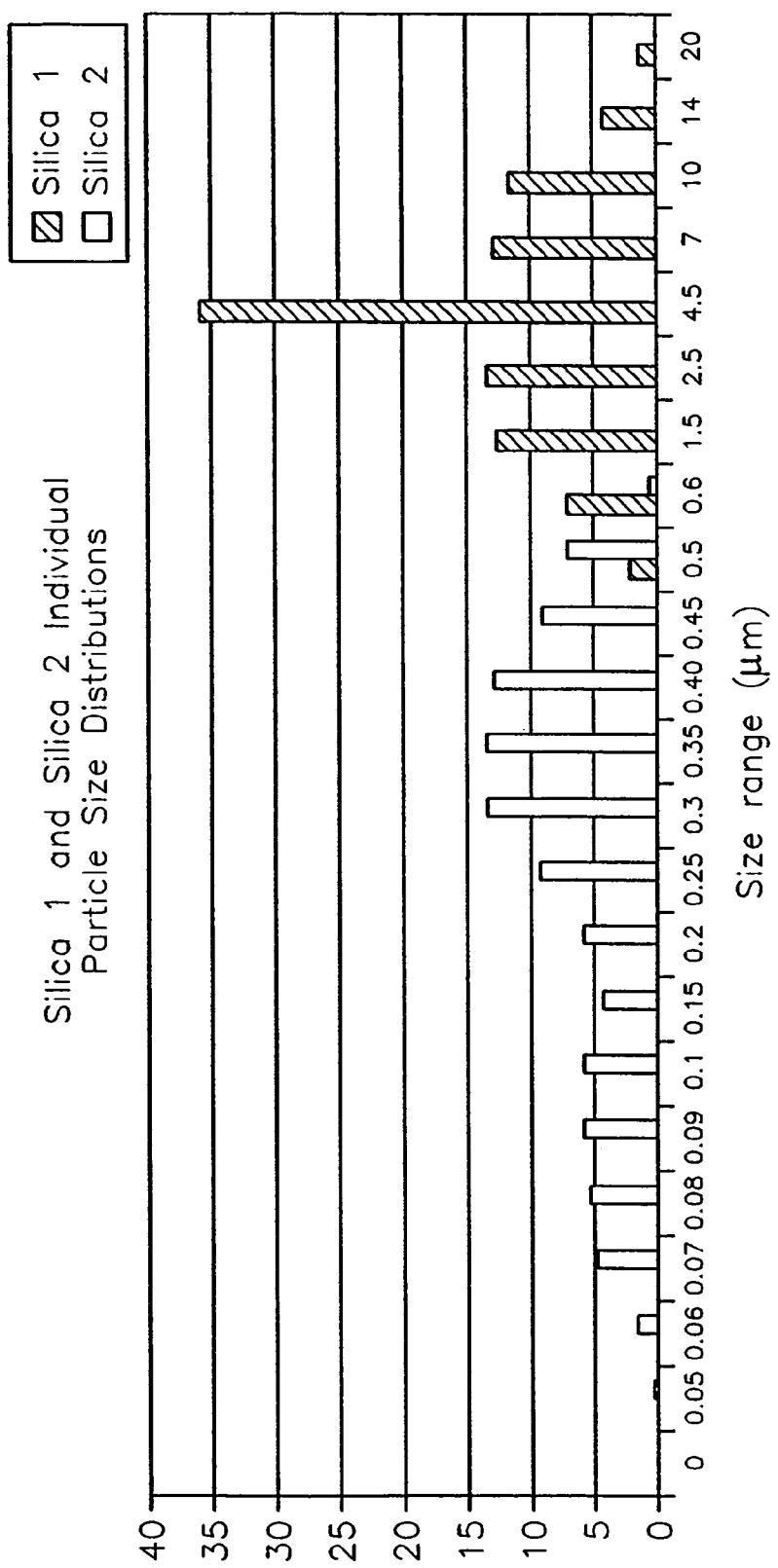
FIG. 10 is a chart illustrating a silica particle size distribution in an insulative material in accordance with an exemplary embodiment of the present invention.

FIG. 10 is a bar chart illustrating an exemplary particle size (i.e., particle size diameter) distribution of two distinct silica fillers (e.g., $SiO_2$) used in an insulative material according to an exemplary embodiment of the present invention. In the exemplary distribution illustrated in FIG. 10, the silica 2 particle size beads range from approximately 0.05 microns to approximately 0.5 microns. Further, the distribution of silica 1 particle size beads ranges from approximately 0.5 microns to approximately 20 microns. The y-axis of the bar chart of FIG. 10 illustrates the percentage of each size of each of the silica 1 and silica 2 particles.

The silica fillers charted in FIG. 10 have proven to be particularly useful when dispersed within insulative materials (e.g., epoxy resin) according to certain exemplary embodiments of the present invention. The individual distribution of the silica diameter sizes for the type of spherical silica designated silica 1 is: 0% are greater than 24 microns, 1.1% are less than 24 microns and greater than 16 microns, 4.0% are less than 16 microns and greater than 12 microns, 11.5% are less than 12 microns and greater than 8 microns, 12.8% are less than 8 microns and greater than 6 microns, 35.8% are less than 6 microns and greater than 3 microns, 13.3% are less than 3 microns and greater than 2 microns, 12.5% are less than 2 microns and greater than 1 microns, 7.0% are less than 1 microns and greater than 0.5 microns, and 2.0% are less than 0.5 microns and greater than 0 microns. The individual distribution of the silica diameter sizes for the type of spherical silica designated silica 2 is: 0% are greater than 0.6 microns, 0.5% are less than 0.6 microns and greater than 0.5 microns, 7.03% are less than 0.5 microns and greater than 0.45 microns, 9.13% are less than 0.45 microns and greater than 0.4 microns, 12.83% are less than 0.4 microns and greater than 0.35 microns, 13.43% are less than 0.35 microns and greater than 0.3 microns, 13.33% are less than 0.3 microns and greater than 0.25 microns, 9.33% are less than 0.25 microns and greater than 0.2 microns, 5.83% are less than 0.2 microns and greater than 0.15 microns, 4.33% are less than 0.15 microns and greater than 0.1 microns, 5.83% are less than 0.1 microns and greater than 0.09 microns, 5.93% are less than 0.09 microns and greater than 0.08 microns, 5.53% are less than 0.08 microns and greater than 0.07 microns, 4.93% are less than 0.07 microns and greater than 0.06 microns, 1.73% are less than 0.06 microns and greater than 0.05 microns, and 0.31% are less than 0.05 microns.

According to yet another exemplary embodiment of the present invention, insulative material is applied across a plurality of bonding wire layers in a multi-tier wire bonded semiconductor device. Thus, short circuiting and other problems associated with wire sweep and sway are reduced and/or eliminated in a multi-tier wire bonded semiconductor device. In certain exemplary embodiments of the present invention, the insulative material may be applied across the multiple bonding wire layers in addition to application of the insulative material across adjacent conductors as described above.

Figure 13A:
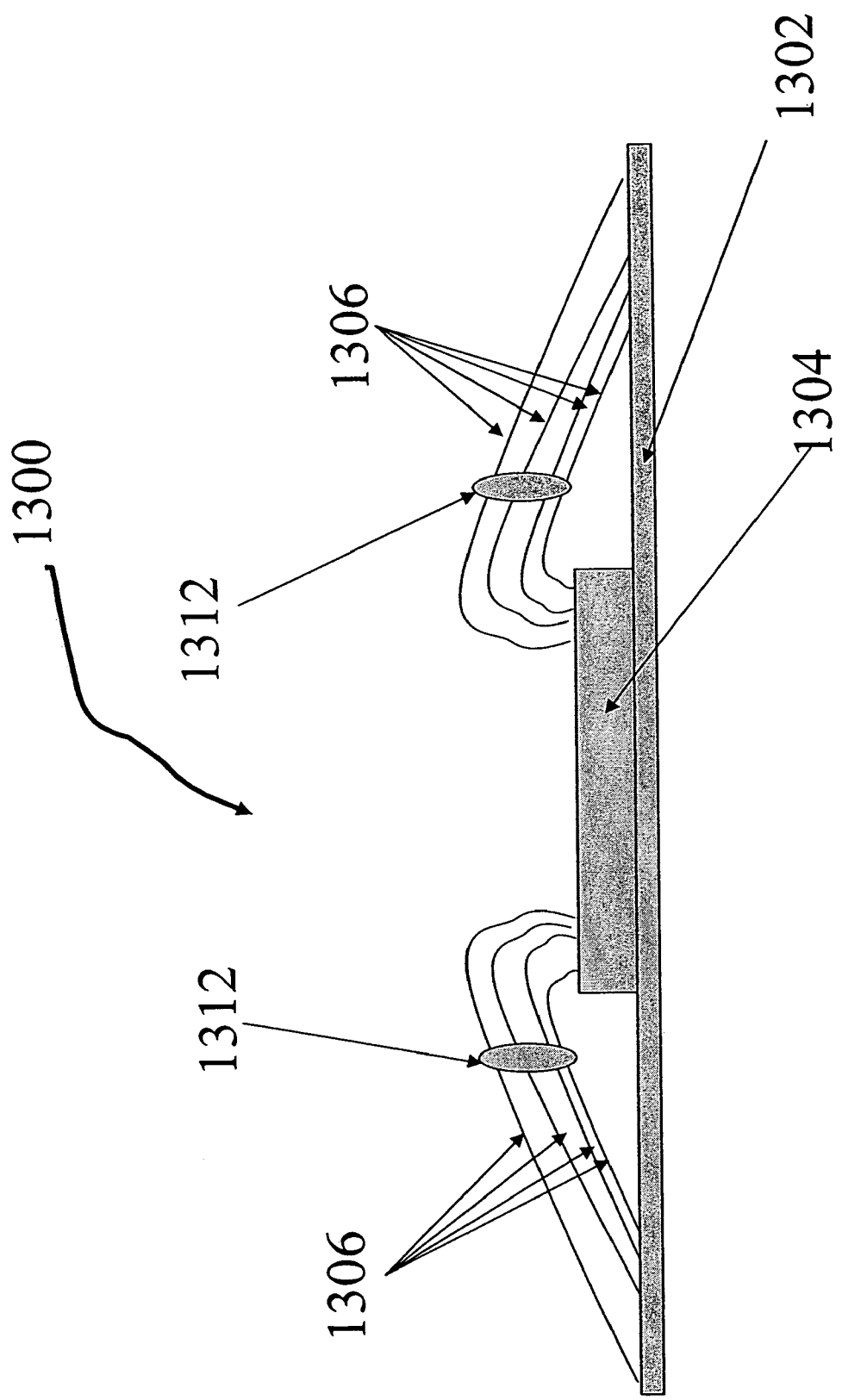
FIG. 13A is a cut away side view of an interconnection between semiconductor elements in a multi-tier wire bonded semiconductor device in accordance with an exemplary embodiment of the present invention.
Figure 13B:
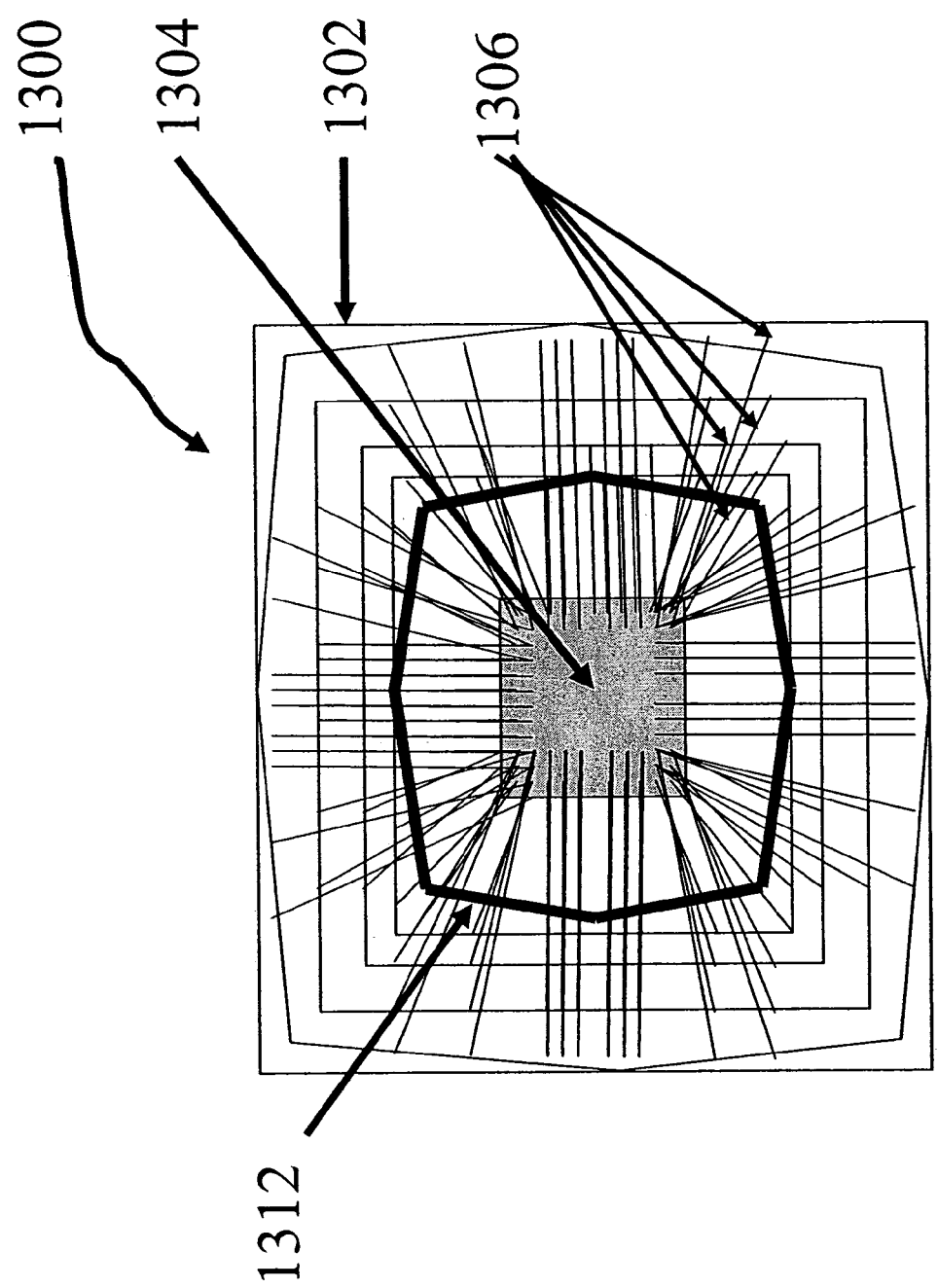
FIG. 13B is a top plan view of the device illustrated in FIG. 13A.

FIG. 13A illustrates a cut away side view of semiconductor device 1300 in accordance with an exemplary embodiment of the present invention, and FIG. 13B is a top view thereof. Semiconductor device 1300 includes semiconductor element 1304 (e.g., a die) mounted on leadframe 1302. For example, semiconductor element 1304 may be mounted to leadframe 1302 using an adhesive. Bonding wires 1306 provide interconnection between semiconductor element 1304 and another portion of semiconductor device 1300, for example, leadframe contacts not illustrated in FIG. 13A. Before an overmold may be applied to the device, insulative material 1312 is applied to a portion of bonding wires 1306. For example, insulative material 1312 may be applied in a rectangular, ring, and/or any suitable shape around or about semiconductor element 1304. As provided above, insulative material 1312 may be positioned at any of a number of locations between semiconductor element 1304 and the other connection point of bonding wires 1306, as desired in a given device.

Figure 14B:
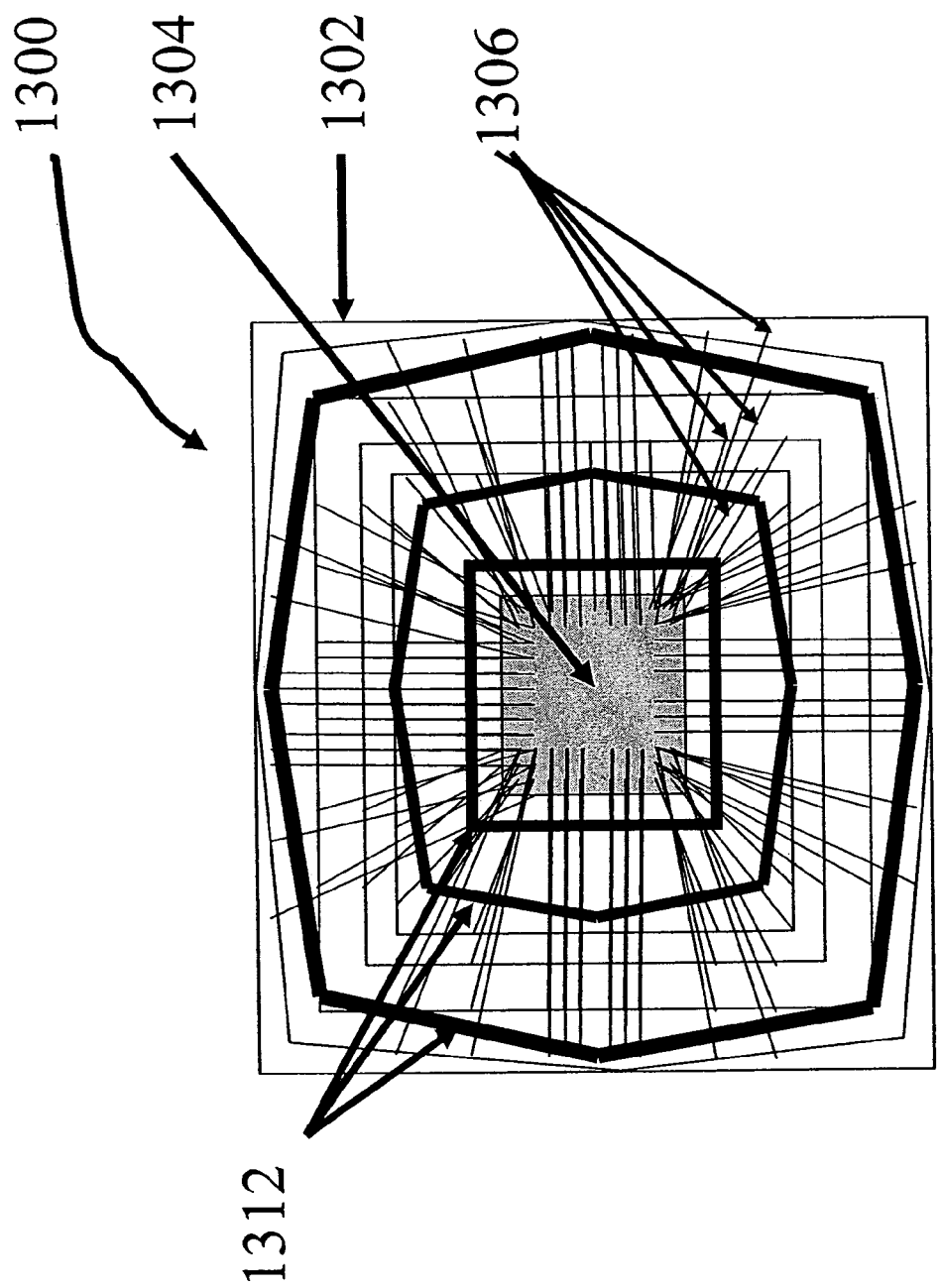
FIG. 14B is a top plan view of the device illustrated in FIG. 14A.

As illustrated in FIGS. 14A and 14B, in device 1400, insulative material 1312 may be positioned at any of number of locations between semiconductor element 1304 and the other connection point of bonding wires 1306, as desired in a given device.

It is also contemplated to have more than one disposition of insulative material on a single semiconductor device at different location or, more specifically, insulative material 1312 may be disposed at any of number of locations and any number of times between semiconductor element 1304 and the other connection point of bonding wires 1306, as desired in a given device. It is also contemplated that insulative material may or may not contact semiconductor element 1304 and/or lead frame 1302, as illustrated in FIG. 14A.

Referring again to FIG. 13A, bonding wires 1306 are provided in layers or tiers (i.e., device 1300 is a multi-tier wire bonded semiconductor device). Insulative material 1312 is provided across each of the bonding wire layers, thereby reducing or substantially eliminating short circuiting due to wire sweep and other associated problems as described herein. Of course, insulative material 1312 is not necessarily provided across each of the bonding wire layers. For example, in certain configurations with four layers of bonding wires (as illustrated in FIG. 13A), insulative material 1312 may be provided across 2, 3, or all 4 layers, as desired in the specific application.

By providing insulative material 1312 across bonding wires 1306, the position of each layer of the bonding wires 1306 with respect to one another is stabilized. By stabilizing the layers of the bonding wires 1306 with respect to one another using insulative material 1312, the risk of short circuiting adjacent layers of bonding wires 1306 (e.g., during application of an overmold) is substantially reduced if not eliminated. Additionally, by stabilizing the position of the layers of bonding wires 1306, open circuiting of bonding wires 1306 during fabrication may also be substantially reduced.

As provided above in connection with alternative embodiments of the present invention, insulative material 1312 may be, for example, a polymer material such as an epoxy resin. Additionally, insulative material 1312 may include insulative particles or beads that distribute between layers of bonding wires 1306 during application of insulative material 1306. Such insulative beads further stabilize layers of bonding wires 1306 with respect to one another. These insulative beads may be, for example, spherical silica particles.

As provided above, insulative beads (e.g., silica particles) or varying types and sizes may be mixed in an insulative material according to certain exemplary embodiments of the present invention. For example, the silica 1 distribution of particles may be mixed with the silica 2 distribution of particles. In one embodiment, 10 parts of the silica 1 distribution of particles is mixed with 3 parts of the type silica 2 distribution of particles. A bar chart illustrating the SiO$_2$ particle size distribution of such a mixture is provided in FIG. 11.

Figure 11:
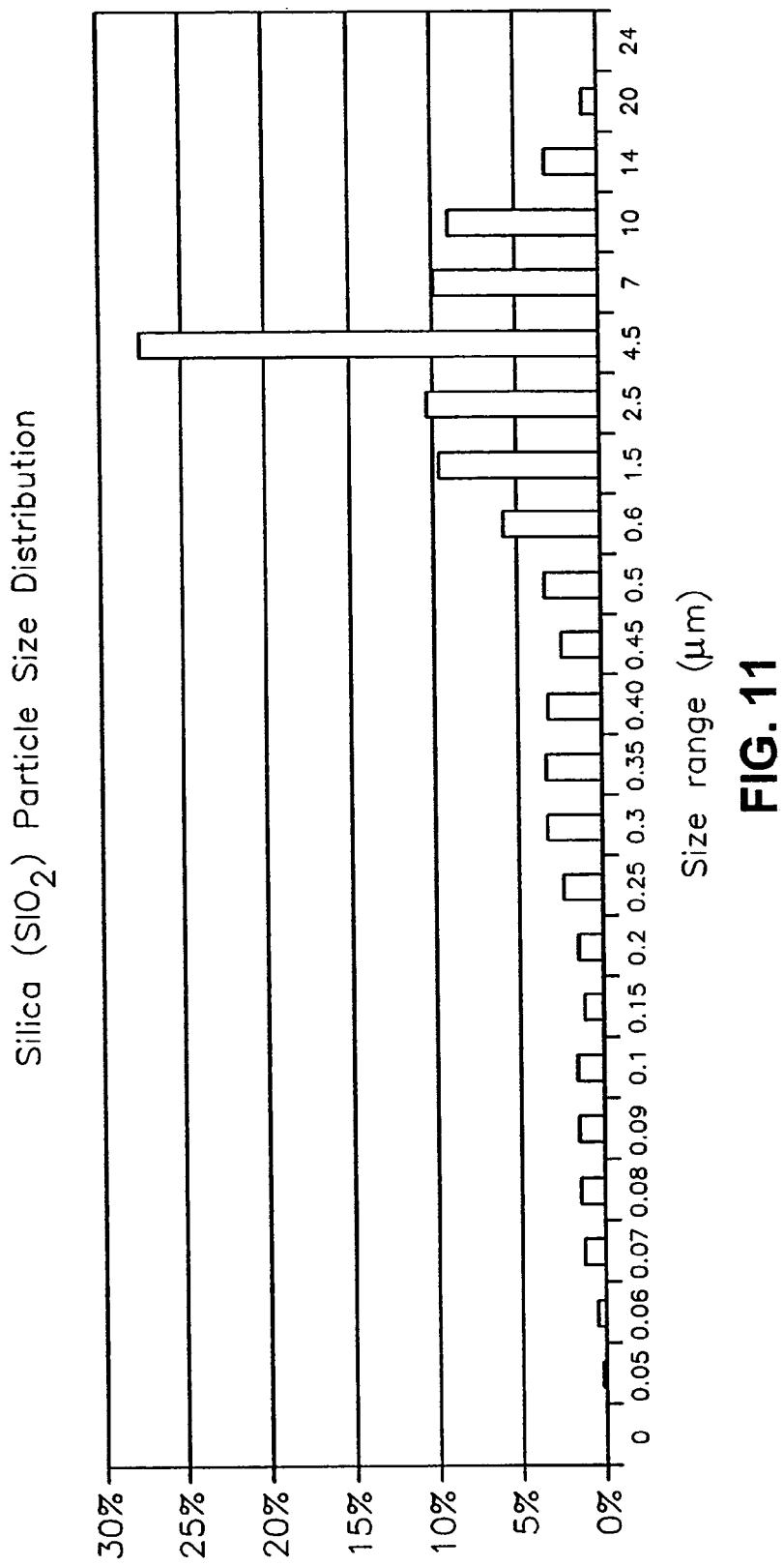
FIG. 11 is another chart illustrating a silica particle size distribution in an insulative material in accordance with an exemplary embodiment of the present invention.

The individual distribution of the silica diameter sizes for the mixture of spherical silica illustrated in FIG. 11 is: 0% are greater than 24 microns, 0.85% are less than 24 microns and greater than 16 microns, 3.08% are less than 16 microns and greater than 12 microns, 8.85% are less than 12 microns and greater than 8 microns, 9.85% are less than 8 microns and greater than 6 microns, 27.54% are less than 6 microns and greater than 3 microns, 10.23% are less than 3 microns and greater than 2 microns, 9.62% are less than 2 microns and greater than 1 microns, 5.5% are less than 1 microns and greater than 0.6 microns, 3.16% are less than 0.6 microns and greater than 0.5 microns, 2.11% are less than 0.5 microns and greater than 0.45 microns, 2.96% are less than 0.45 microns and greater than 0.4 microns, 3.1% are less than 0.4 microns and greater than 0.35 microns, 3.08% are less than 0.35 microns and greater than 0.3 microns, 2.15% are less than 0.3 microns and greater than 0.25 microns, 1.35% are less than 0.25 microns and greater than 0.2 microns, 1.0% are less than 0.2 microns and greater than 0.15 microns, 1.35% are less than 0.15 microns and greater than 0.1 microns, 1.37% are less than 0.1 microns and greater than 0.09 microns, 1.28% are less than 0.09 microns and greater than 0.08 microns, 1.14% are less than 0.08 microns and greater than 0.07 microns, 0.4% are less than 0.07 microns and greater than 0.06 microns, 0.07% are less than 0.06 microns and greater than 0.05 microns, and 0% are less than 0.05 microns.

It has been found that the application of an insulative material according to the present invention is particularly useful in protecting bonding wires in semiconductor packages from wire sweep during fabrication (e.g., during the overmolding process after application of the insulative material), where the length to diameter ratio of the longest bonding wires is greater than 250. In certain embodiments, the process includes dispensing the insulative material (e.g., while the semiconductor device is still on the wirebonding machine), and thereafter a period of time is provided for the material to flow. The flow time can be, for example, from two to 50 seconds (and more specifically between 7 and 25 seconds) depending on several conditions such as size of the semiconductor device, temperature of the semiconductor device, temperature of the insulative material during dispensing, and the density of the conductors providing interconnection between the elements. Thereafter, the insulative material is cured using some combination of heat, UV radiation, visible radiation, and IR radiation.

As provided herein, the application of the insulative material including insulative particles of specific sizes and quantities is particularly useful in improving the ability of the insulative material to flow between and separate, short-circuited bonding wire pairs. For example, small diameter inorganic particles may be used to fill in between the bonding wires. Furthermore, the type of insulative material (e.g., polymer resin) utilized may enhance the surface energy properties of the insulative material/encapsulant to maximize the short-circuit prevention and reduction properties.

For example, the scale of the insulative particles (i.e., filler particles) is explicitly smaller than the desired gaps between adjacent bonding wires, and is added in specific sizes and quantities to improve the flow of the insulative material. The insulative material/encapsulant may be rapidly cured through exposure to a UV source of radiation, or to a combination of UV radiation, visible radiation, and infrared radiation. The methods disclosed herein are particularly useful when the insulative material is applied immediately or shortly after wirebonding, and when the bonding wire lengths are at least 250 times larger than the bonding wire diameter.

Through the various exemplary embodiments disclosed herein, the present invention may provide packaged semiconductor devices with longer, thinner, bonding wires, and with a higher density of I/O connections, at smaller pad pitch. The yield of the semiconductor devices is also increased, particularly with respect to post-bond substrate handling, overmolding, and globtop encapsulation. The yield of the semiconductor devices is increased by preventing shorts of fine pitch, small diameter wirebonded semiconductor devices through the application of the insulative material including a combination of small and intermediate size insulative particles (e.g., spherical silica particles) to the device for dispersion and distribution between adjacent bonding wires, and subsequently curing/gelling the insulative material (e.g., on the wirebonder) using heat, exposure to radiation (ultraviolet, visible, and/or infrared), and/or through a thermal batch process. According to an exemplary embodiment of the present invention, the insulative material, including the combination of small and intermediate size spherical silica, is applied using an automatic dispensing machine as soon as is practical after wirebonding.

The curing and/or gelling of the insulative material may vary depending upon the embodiment of the present invention utilized. For example, the insulative material may be cured/gelled directly on the wirebonder using heat and exposure to ultraviolet radiation. According to another exemplary embodiment of the present invention, the insulative material may be cured/gelled on the wirebonder by heat and exposure to one of more of ultraviolet, visible, and infrared radiation. According to yet another exemplary embodiment of the present invention, the insulative material may be cured/gelled using a thermal batch process.

The insulative material may be an epoxy encapsulant material including substantially spherical silica particles that are, at least partially, smaller than the desired space between adjacent bonding wires in an ultrafine pitch wirebonded semiconductor device. In such an embodiment, the encapsulant material may be designed such that a specific intensity, duration, and wavelength distribution of ultraviolet radiation, visible radiation, and/or infrared radiation, rapidly gels or at least partially cures the encapsulant material. Further, the characteristics of the insulative material, and the application process parameters thereof, may be designed such that as the insulative material is dispensed onto the wirebonded semiconductor device, it covers the entire bonding wire(s), or a portion of the bonding wire(s).

Further still, the insulative material may be applied in any of a number of directions. For example, the insulative material may be applied from a leadframe contact towards an inner semiconductor element of the semiconductor device (e.g., a die). Alternatively, the insulative material may be applied from an inner semiconductor element of the semiconductor device (e.g., a die) towards a leadframe contact of the semiconductor device. Yet another alternative would be to apply the insulative material from directly above (or below) the bonding wires themselves.

Before application of the insulative material, the semiconductor device is preferably heated, for example, to a temperature between 50° C. and 125° C., and more specifically to a temperature between 80° C. and 100° C. Further, the insulative material dispenser is also preferably heated, for example, to a temperature between 35° C. and 85° C., and more specifically to a temperature between 50° C. and 70° C. By heating the insulative material in the insulative material dispenser, it is easier to dispense the insulative material.

As provided above, the insulative material preferably includes a filler material including insulative particles. For example, the filler material may be assembled from combinations of silica with size distributions determined based on various criteria. For example, the size distribution may be based on the following objectives: (1) to carry small silica particles into the narrow space between adjacent bonding wires, thereby driving the bonding wires apart; (2) to force the silica (e.g., by a capillary force) to provide a relatively high level of electrical isolation between adjacent bonding wires; (3) to fix the silica and the remainder of the insulative material (e.g., polymer) in place to stabilize the bonding wires, thereby sustaining the electrically insulative capabilities of the insulative material; (4) to minimally interfere with the fragile wire loops during the application of the insulative material; (5) to increase the packing density of the silica particles to achieve a low CTE; and (6) to provide smooth flowing capabilities of the insulative material.

The process of applying the insulative material may include dispensing of the insulative material, and curing the insulative material while the semiconductor device is on the wirebonding machine, such that the delicate loops of the thin bonding wire are stabilized and preserved immediately after (or shortly thereafter) the wirebonding process is complete.

Further still, the dispensing of the insulative material may occur while successive semiconductor devices are being wirebonded, such that a relatively quick and efficient fabrication process may be accomplished. For example, while a first semiconductor device is receiving the insulative material from the insulating material dispenser (and subsequently being cured/gelled), a second semiconductor device is being wirebonded. Such operations (i.e., application of insulative material, and curing/gelling of the insulative material) may be applied to both the first and second semiconductor devices on the same wirebonding apparatus.

As provided above, the insulative material/encapsulant is applied immediately after wirebonding (or almost immediately after, or as soon as practical after wirebonding using an automatic dispensing machine) and the curing/gelling is performed by application of heat and at least one of radiant energy exposure (e.g., ultraviolet, visible, or infrared), or by a thermal batch process. For example, the thermal process used to cure the insulative material may include: (1) a ramp in temperature; (2) a soaking period; and (3) a ramp down in temperature.

The dispensing means for heating and dispensing the insulative material (including the insulative particles) may be provided as a new subsystem added to an existing wirebonding device, or may be provided as a stand alone system.

Through the various embodiments of the present invention disclosed herein, the following benefits are achieved: (1) the insulative particles allow the insulative material to fill in between the bonding wires (which is particularly valuable in a semiconductor device that utilizes ultra fine pitch wirebonding); (2) a semiconductor device requiring substantially less volume of a potentially higher cost encapsulating material is provided, as opposed to a semiconductor device where the entire package is molded with the same material; and (3) a relatively low cost conventional molding compound or glob top encapsulation material (and associated equipment) may be used to overmold the package.

The application systems used to facilitate the various embodiments of the present invention may be designed to ensure that the packaging process does not suffer a reduction in productivity by the inclusion of the application of the insulative material. For example, through the use of software controls and sensor fusion, the system can integrate the functions of dispensing and curing the insulative material while concurrently performing wirebonding operations. Further, after application of the insulative material, as the packaging process continues (e.g., through resin transfer molding, glob top encapsulation, etc.), the fine bonding wires are protected from motion that have resulted in short-circuiting of adjacent bonding wires. This is at least partially due to the rapid flow of the insulative material (e.g., molding compound or encapsulant).

Figure 12:
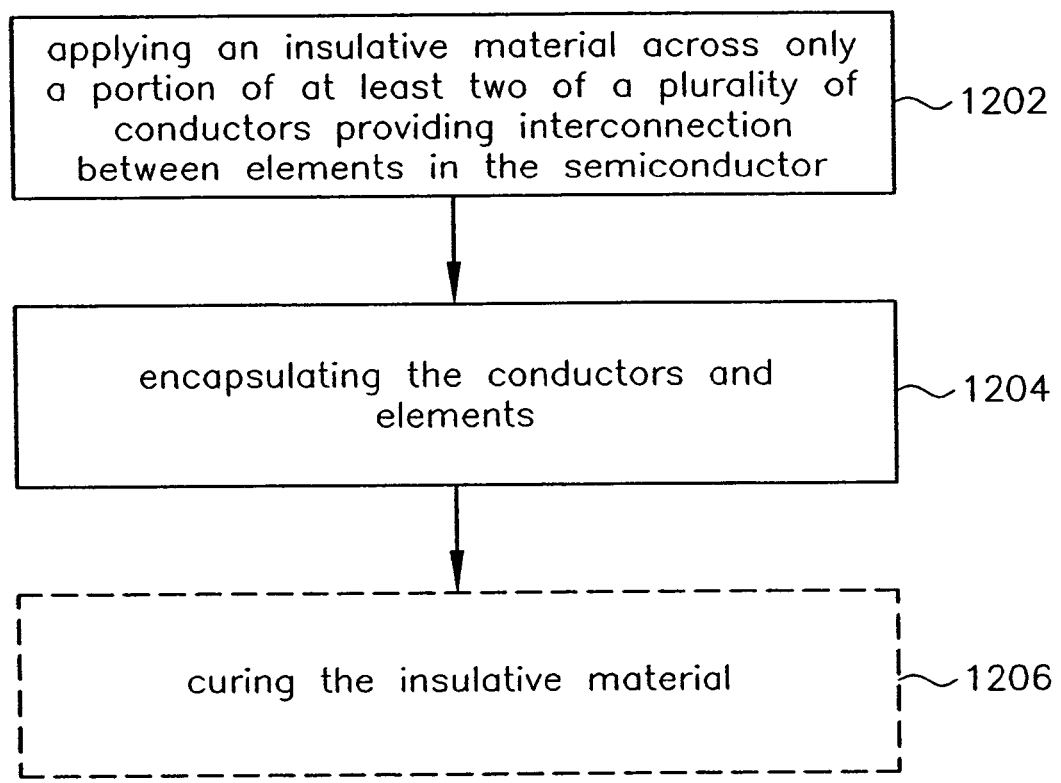
FIG. 12 is a flow diagram illustrating a method of packaging a semiconductor device in accordance with an exemplary embodiment of the present invention.

FIG. 12 is a flow diagram illustrating a method of packaging a semiconductor device. At step 1202, an insulative material is applied across only a portion of at least two of a plurality of conductors providing interconnection between elements in the semiconductor device. At step 1204, the conductors and semiconductor elements are encapsulated, thereby packaging the semiconductor device. At optional step 1206, the insulative material is cured after the applying step and before the encapsulating step.

Although the present invention has been described primarily in relation to a ring or rectangular shaped insulative material around or about a semiconductor element included in the semiconductor device, it is not limited thereto. The insulative material may be provided in a number or configurations (e.g., a linear bridge of insulating material), so long as the conductors are stabilized to reduce wire sweep.

Further, the insulative compound may be applied in a substantially circumferential shape about an inner element of the semiconductor device. The substantially circumferential shape may be any of a number of geometric shapes such as a ring, a circle, an oval, a square or a rectangle. Further still, because the geometric shape is substantially circumferential, it does not necessarily completely surround the inner element of the semiconductor device.

Although the present invention has been described primarily in relation to an insulative material being a polymer material such as an epoxy resin, it is not limited thereto. Various alternative insulative materials may be utilized so long as the material provides stability to conductors providing interconnection between elements of the semiconductor device.

In embodiments of the present invention including insulative particles in the insulative material, the particles have been described primarily in relation to silica particles; however, the particles are not limited thereto. Various alternative particles or beads may be utilized in the insulative material so long as the particles may disperse between adjacent conductors providing interconnection between elements of the semiconductor device.

It will be appreciated that other modifications can be made to the illustrated embodiments without departing from the scope of this invention, which is separately defined in the appended claims.

What is claimed:

1. A method of packaging a semiconductor device including at least one semiconductor element, a carrier, and a plurality of conductors in a multi-tiered configuration providing interconnection between the at least one semiconductor element and the carrier, the method comprising the steps of:

applying at least one bead of an insulative material across only a portion of at least two of the plurality of conductors per layer, the insulative material comprising insulative particles having a diameter smaller than a gap between adjacent ones of the conductors, the plurality of conductors providing interconnection between elements in the multi-tier wire bonded semiconductor device; and encapsulating the conductors and elements, thereby packaging the semiconductor device.

2. The method of claim 1 further comprising the step of curing the insulative material after the applying step.

3. The method of claim 2 wherein the curing step includes at least one of heating the insulative material and exposing the insulative material to UV radiation.

4. The method of claim 1 wherein the applying step includes applying an insulative compound comprising the insulative particles as spherical silica particles to the portion of a plurality of conductors.

5. The method of claim 4 wherein the insulative compound is applied in a substantially circumferential manner about the at least one the semiconductor element.

6. The method of claim 4 wherein the insulative compound is applied in at least two geometric shape structures, each of the geometric shape structures substantially surrounding the at least one the semiconductor element in a circumferential manner.

7. The method of claim 1 wherein the applying step includes applying the insulative material to at least a portion of the at least one semiconductor element in addition to the portion of the plurality of conductors.

8. The method of claim 1 wherein the applying step includes applying the insulative material to at least a portion of the carrier in addition to the portion of the plurality of conductors.

9. The method of claim 1 wherein the applying step includes applying the insulative material in at least two distinct structures around a peripheral portion of the at least one the semiconductor element, the two structures not being in contact with one another.

10. A method of packaging a semiconductor device including at least one semiconductor element, a carrier, and a plurality of conductors in a multi-tiered configuration providing interconnection between the at least one semiconductor element and the carrier, the method comprising the steps of:

applying an insulative material across only a portion of at least two of the plurality of conductors per layer, the insulative material comprising insulative particles having a diameter smaller than a gap between adjacent ones of the conductors, thereby reducing the potential for short circuiting between the adjacent conductors; and curing the insulative material.

11. The method of claim 10 wherein the applying step includes applying the insulative material including silica particles and a polymer resin.

12. The method of claim 10 wherein the curing step includes exposing the insulative material to at least one of ultraviolet, visible, and infrared radiation.

13. The method of claim 10 wherein the curing step includes heating the insulative material and exposing the insulative material to at least one of ultraviolet, visible, and infrared radiation.

14. The method of claim 10 wherein the curing step includes applying a thermal process to the insulative material including a ramp up in temperature, a soak in temperature, and a ramp down in temperature.

15. The method of claim 10 wherein the applying step includes applying the insulative material to the device wherein the insulative particles occupy between 50 and 85 percent of the weight of the insulative material.

16. The method of claim 10 wherein the applying step includes applying the insulative material to the device wherein the insulative particles have a maximum diameter of 20 microns.

17. The method of claim 10 wherein the applying step includes applying the insulative material to the device wherein the insulative particles have a median diameter of approximately 4.5 microns.

18. The method of claim 10 wherein the applying step includes applying the insulative material to the device wherein the insulative particles have a mean diameter of approximately 4.1 microns.

19. The method of claim 10 wherein through the applying step the insulative particles disperse between adjacent ones of the conductors, thereby providing insulated separation between the adjacent ones of the conductors.

20. The method of claim 10 further comprising the step of heating the semiconductor device to a temperature of between 50 and 125° C. before the applying step.

21. The method of claim 10 further comprising the step of heating the semiconductor device to a temperature of between 80 and 100° C. before the applying step.

22. The method of claim 10 further comprising the step of heating the insulative material to a temperature between 35 and 85° C. before the applying step.

23. The method of claim 10 further comprising the step of heating the insulative material to a temperature between 50 and 70° C. before the applying step.

24. The method of claim 10 further comprising the step of encapsulating the semiconductor device.

25. The method of claim 24 wherein the encapsulating step includes encapsulating the semiconductor device with an overmold encapsulant.

26. The method of claim 24 wherein the encapsulating step includes encapsulating the semiconductor device with a globtop encapsulant.

27. The method of claim 10 wherein the applying step includes applying the insulative material to at least a portion of the at least one semiconductor element in addition to the portion of the plurality of conductors.

28. The method of claim 10 wherein the applying step includes applying the insulative material to at least a portion of the carrier in addition to the portion of the plurality of conductors.

* * * * *